(12) United States Patent
Hirota et al.

(10) Patent No.: US 10,989,739 B2
(45) Date of Patent: Apr. 27, 2021

(54) PROBE CARD HOLDER

(71) Applicant: KABUSHIKI KAISHA NIHON MICRONICS, Tokyo (JP)

(72) Inventors: Hideki Hirota, Tokyo (JP); Takao Yasuta, Tokyo (JP); Takayuki Narumi, Tokyo (JP); Yoshinori Kikuchi, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 63 days.

(21) Appl. No.: 16/564,293

(22) Filed: Sep. 9, 2019

(65) Prior Publication Data

US 2020/0103442 A1 Apr. 2, 2020

(30) Foreign Application Priority Data

Sep. 28, 2018 (JP) .............................. JP2018-183116

(51) Int. Cl.
*G01R 1/073* (2006.01)
*G01R 1/04* (2006.01)

(52) U.S. Cl.
CPC ........... *G01R 1/07342* (2013.01); *G01R 1/04* (2013.01)

(58) Field of Classification Search
None
See application file for complete search history.

(56) References Cited

U.S. PATENT DOCUMENTS 5,695,068 A * 12/1997 Hart ...................... B65D 85/38
206/486
7,586,316 B2 * 9/2009 Kuniyoshi ......... G01R 1/07307
324/756.03
7,598,727 B1 * 10/2009 Dang ................. G01R 1/07342
324/756.03
2002/0024354 A1 * 2/2002 Pietzschmann .... G01R 1/07378
324/750.22
2008/0297184 A1 * 12/2008 Miura ................ G01R 1/07364
324/762.05
2015/0285838 A1 10/2015 Mori et al.

FOREIGN PATENT DOCUMENTS

| JP | 63293935 A | * | 11/1988 | |
| JP | 01161173 A | * | 6/1989 | |
| JP | 2000298141 A | * | 10/2000 | |
| JP | 2004140241 A | * | 5/2004 | ......... G01R 31/2889 |
| JP | 2008134169 A | * | 6/2008 | ......... G01R 31/2889 |
| JP | 2014-103358 A | | 6/2014 | |

* cited by examiner

*Primary Examiner* — Paresh Patel
(74) *Attorney, Agent, or Firm* — Bacon & Thomas, PLLC (57) ABSTRACT

The present invention provides a probe card holder including a plate-shaped frame formed with an opening approximately the same size as the probe card, a plurality of card bottom surface holding portions that are provided around a peripheral edge of the opening in the frame and that hold a bottom surface of the probe card while biasing the bottom surface, and a plurality of card top surface supporting portions that support the top surface of the probe card. Each card bottom surface holding portion includes an L-shaped member with a base portion and a bottom surface supporting portion, a knob that is linked to a tip end portion of the base portion and a biasing member that is disposed between the knob and the top surface of the frame and that biases the bottom surface supporting member upward toward the bottom surface of the frame.

7 Claims, 5 Drawing Sheets

PROBE CARD HOLDER

CROSS-REFERENCE TO RELATED APPLICATIONS

The present application claims, under 35 USC 119, priority of Japanese Patent Application No. 2018-183116 filed on Sep. 28, 2018.

FIELD OF THE INVENTION

The present disclosure relates to a probe card holder and can be applied to, for example, a probe card holder that holds a probe card used in an inspection system.

BACKGROUND ART

The electrical properties of the plurality of integrated circuits formed on a semiconductor wafer are inspected using an inspection system before the integrated circuits are cut away from the semiconductor wafer. Such an inspection system uses a probe card that is wired with a plurality of probes that make electrical contact with the electrode terminals in each integrated circuit.

Usually, a worker will handle a probe card directly with their hands when mounting the probe card to the inspection system or removing the probe card from the inspection system. Because of this, the worker may accidentally touch and damage the probes on the probe card.

Patent Document 1 discloses a probe card transfer case that houses a probe card in order to make it easier to handle a probe card. The probe card transfer case disclosed in Patent Document 1 is formed of an upper case and a lower case. More specifically, a worker positions and places the probe card on the base of the lower case and, with the probe card placed on the lower case, covers the lower case with the upper case and fixes the two cases together. In other words, with the probe card transfer case disclosed in Patent Document 1, the probe card is fixed between the upper case and the lower case.

PRIOR ART DOCUMENTS

Patent Documents

[Patent Document 1] JP2014103358A

SUMMARY OF INVENTION

Problem to be Solved by Invention

The upper case in the probe card transfer case disclosed in Patent Document 1 is formed with a plate-shaped top plate. This top plate may come into contact with (interfere with) the plurality of electrical components formed on the top surface of the probe card, which is a problem.

In addition, the probe card transfer case disclosed in Patent Document 1 involves using two members—the upper case and the lower case—to fix the probe card and is difficult to handle. Therefore, a more easily operable product is required.

In light of this, there is a demand for a probe card holder that can prevent interference with the plurality of electrical components formed on the top surface of a probe card, has a simpler operation to achieve holding the probe card, and can stably hold the probe card.

Means for Solving Problem

In order to solve the above-described problem, the probe card holder according to the present disclosure is a probe card holder for holding a probe card on a bottom side of a plate-shaped frame, the probe card holder including (1) the frame that is formed with an opening at a central portion of the frame, the opening approximately the same size as the probe card; (2) a plurality of card bottom surface holding portions that are provided around a peripheral edge of the opening in the frame and that hold a peripheral bottom surface of the probe card while biasing the bottom surface upward; and (3) a plurality of card top surface supporting portions that are provided on a bottom surface of the peripheral edge of the opening in the frame and that support a peripheral top surface of the probe card that is held by the plurality of card bottom surface holding portions, each card bottom surface holding portion including (1-1) an L-shaped member with a base portion provided from the bottom surface to the top surface of the frame, and a bottom surface supporting portion located on the bottom side of the frame; (1-2) a knob that is linked to a tip end portion of the base portion of the L-shaped member; and (1-3) a biasing member that is disposed between the knob and the top surface of the frame and that biases the bottom surface supporting member in the L-shaped member upward toward the bottom surface of the frame.

Effect of Invention

According to the present disclosure, the probe card holder can prevent interference with the plurality of electrical components formed on the top surface of a probe card, has a simpler operation to achieve holding the probe card, and can stably hold the probe card.

DESCRIPTION OF THE EMBODIMENTS

(A) First embodiment

A first embodiment of a probe card holder according to the present disclosure is described in detail below with reference to the drawings.

(A-1) Configuration of First Embodiment

[Configuration of Probe Card]

First, an exemplary configuration of a probe card that is transferred using the probe card holder according to the first embodiment is described.

Figure 3:
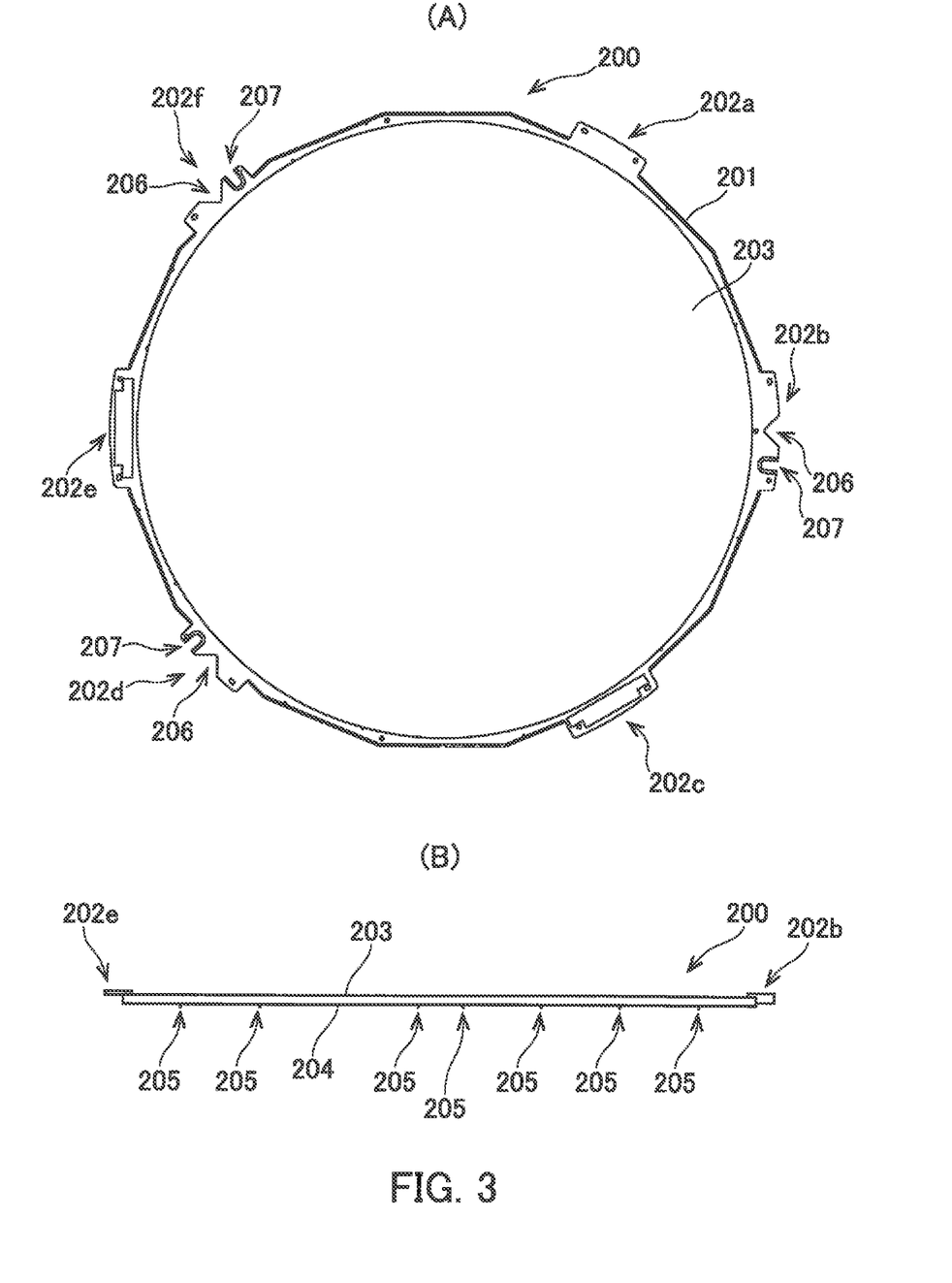
FIG. 3 is a configuration diagram for illustrating the configuration of a probe card according to the first embodiment.

FIG. 3 is a configuration diagram for illustrating the configuration of the probe card according to the first embodiment. FIG. 3(A) is a plan view of the probe card and FIG. 3(B) is a side view of the probe card.

In FIG. 3(A), a probe card 200 according to the first embodiment includes a circular or polygonal (for example, a 16-sided) plate-shaped body 201 and a plurality of engagement portions 202a to 202f provided circumferentially at equal intervals around the peripheral edge of the top surface of the body 201.

A plurality of engaged portions (not shown) are formed in a table included in an inspection system (not shown). When the probe card 200 is set on the table in the inspection system, each engagement portion 202a to 202f engages with a corresponding engaged portion. Of the engagement portions 202a to 202f, the engagement portions 202b, 202d and 202f each include a substantially triangular notch portion 206 and a U-shaped engagement portion 207. The engagement portions 202a to 202f engage with corresponding engaged portions in the table in the inspection system such that the probe card 200 is positioned on the table and can be fixed to the table in the inspection system.

A plurality of probes 205 are formed on the body 201. As illustrated in FIG. 3(B), one end (lower end) of each probe 205 protrudes from a bottom surface 204 of the body 201. When the probe card 200 is set on the table in the inspection system and is pushed downward by an object to be inspected (integrated circuits on a semiconductor wafer), the ends of the probes 205 that protrude from the bottom surface 204 of the body 201 make electrical contact with the electrodes in the object to be inspected.

A plurality of electrodes (not shown) are disposed across almost the entire top surface 203 of the body 201. Although not shown in FIG. 3(A), the top surface of the body 201 is provided with a plurality of electronic circuits for inspecting the electrical properties of the object to be inspected. The other ends (upper ends) of the probes 205 make contact with the electrodes in the electronic circuits.

The configuration of the probe card 200 described above is merely exemplary and is not limited to that illustrated in FIG. 3. A variety of different probe cards 200 may be used provided that the probe card can be held by the probe card holder that is to be described later.

[Configuration of Probe Card Holder]

Figure 1:
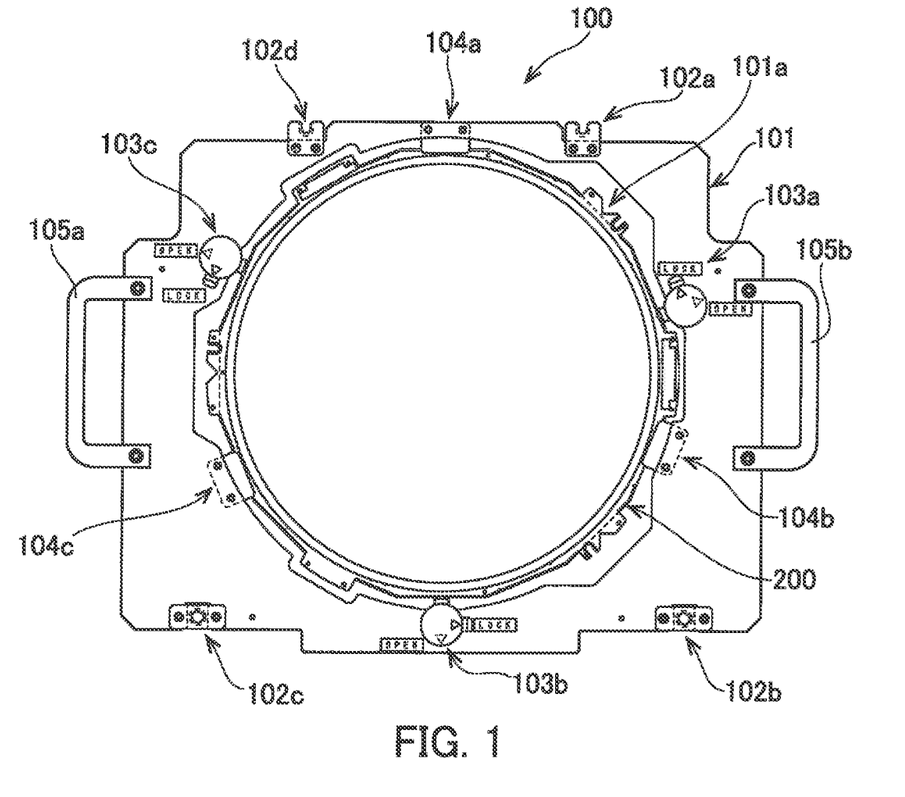
FIG. 1 is a plan view of a probe card holder according to a first embodiment.
Figure 2:
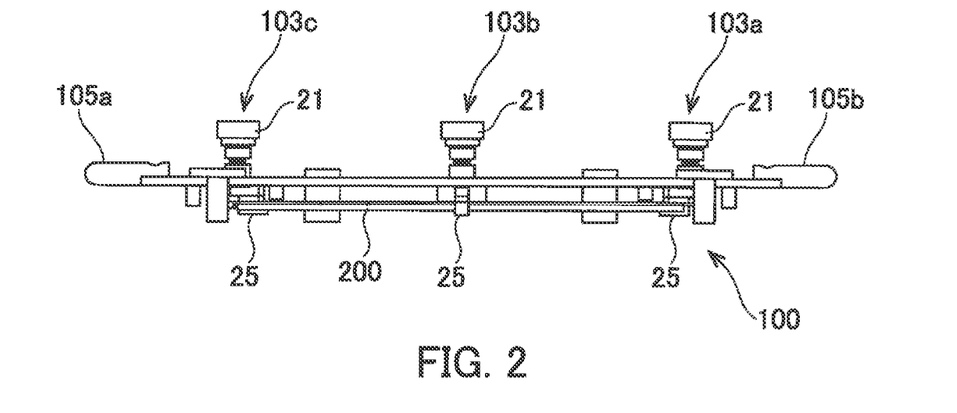
FIG. 2 is a side view of the probe card holder according to the first embodiment.

FIG. 1 is a plan view of a probe card holder according to the first embodiment. FIG. 2 is a side view of the probe card holder according to the first embodiment.

In FIGS. 1 and 2, a probe card holder 100 according to the first embodiment includes a frame 101, a plurality of (for example, four) positioning blocks 102 (102a to 102d), a plurality of (for example, three) card bottom surface holding portions 103 (103a to 103c), a plurality of (for example, three) card top surface supporting portions 104 (104a to 104c) and a plurality of (for example, two) handles 105a and 105b.

FIGS. 1 and 2 illustrate a state where the probe card 200 is held by the probe card holder 100.

The probe card holder 100 is used by a worker to handle the probe card 200 when, for example, the probe card 200 is stored in a case and is to be removed from the case and set on the table in the inspection system, or when the probe card 200 is to be removed from the table in the inspection system for maintenance.

As illustrated in FIG. 2, the card bottom surface holding portions 103a to 103c of the probe card holder 100 support bottom surface portions around the peripheral edge of the probe card 200 and the card top surface supporting portions 104a to 104c of the probe card holder 100 support top surface portions around the peripheral edge of the probe card 200. With this configuration, the probe card 200 is stably held.

[Opening 101a in Frame 101]

The frame 101 is a plate-shaped member that is larger than the probe card 200 and has a substantially rectangular external shape. The external shape of the frame 101 is not particularly limited and may be changed as appropriate according to, if using a case to store the probe card 200, for example, the shape of the inside of the case or another shape.

A central portion of the plate-shaped frame 101 is approximately the same size as the external size of the probe card 200 and is formed with an opening 101a that has a shape corresponding to the external shape of the probe card 200. By forming the opening 101a at the central portion of the frame 101, the plurality of electrical components on the top surface 203 of the probe card 200 can be prevented from making contact with (interfering with) members of the probe card holder 100 when the probe card 200 is held using the probe card holder 100. As a result, the electrical components in the probe card 200 can be prevented from being damaged.

Because the opening 101a is formed at the central portion of the frame 101, the worker can check the state of the top surface 203 of the probe card 200 that is held below the opening 101a. For example, the worker can check if any foreign matter is on the top surface 203 of the probe card 200.

As illustrated in FIG. 2, the shape of the opening 101a in the frame 101 according to this embodiment is either approximately the same size or slightly larger than the size of the external shape of the probe card 200. FIG. 2 illustrates a case where the opening 101a is formed into a shape that corresponds to the external shape of the probe card 200. As illustrated in FIG. 3(A), this is because the area including the electrical components on the probe card 200 is a large area that spans almost the entire area of the top surface 203. The shape of the opening 101a may be different from that illustrated in FIG. 2 provided that the shape of the opening 101a can at least prevent interference with electrical components.

[Positioning Blocks 102]

The plurality of positioning blocks 102a to 102d are members that are used to position the probe card holder 100 when the probe card 200 is held by the probe card holder 100 or when the probe card 200 is removed from the probe card holder 100.

This embodiment deals with an exemplary case in which the positioning blocks 102a and 102d are provided on one of the four sides of the frame 101 and the positioning blocks 102b and 102b are provided on a side of the frame 101 opposite to the side provided with the positioning blocks 102a and 102d.

For example, inside the case that stores the probe card 200, a plurality of positioning members (not shown) are provided at positions that correspond to the positions of the positioning blocks 102a to 102d in the probe card holder 100. When the probe card 200 stored in the case is to be removed using the probe card holder 100, the worker fits the positioning blocks 102a to 102d of the probe card holder 100 into the positioning members (not shown) inside the case. With this configuration, the probe card holder 100 can be positioned relative to the case and the probe card 200 in the case can be removed at the correct position and orientation.

The plurality of positioning members (not shown) formed inside the case are formed at a predetermined height from the base of the case. Therefore, when the positioning blocks 102a to 102d in the probe card holder 100 are fitted into the positioning members (not shown) inside the case, the probe card 200 is positioned below the opening 101a of the probe card holder 100 and a sufficient height can be guaranteed when L-shaped members 25 (described later, see FIG. 4) in the card bottom surface holding portions 103 are pulled out downwards.

The same applies to the table in the inspection system. For example, a plurality of positioning members (not shown) are provided at positions that correspond to the positions of the positioning blocks 102a to 102d in the probe card holder 100. When the probe card 200 held by the probe card holder 100 is mounted to the table in the inspection system, the worker fits the positioning blocks 102a to 102d of the probe card holder 100 into the positioning members (not shown) in the table. With this configuration, the probe card holder 100 can be positioned relative to the table in the inspection system and the probe card 200 can be mounted to the table at the correct position and orientation.

The plurality of positioning members (not shown) formed in the table are formed at a predetermined height from the base of the table. Therefore, when the positioning blocks 102a to 102d of the probe card holder 100 are fitted into the positioning members (not shown) inside the case, the probe card 200 is positioned below the opening 101a of the probe card holder 100 and sufficient height can be guaranteed when the L-shaped members 25 (described later, see FIG. 4) of the card bottom surface holding portions 103 are pulled out downwards.

[Card Bottom Surface Holding Portions 103]

The plurality of card bottom surface holding portions 103 (103a to 103c) hold bottom surface portions around the peripheral edge of the probe card 200 to be held while biasing the bottom surface portions upward. Each card bottom surface holding portion 103 (103a to 103c) can rotate between an OPEN position and a LOCK position. At the LOCK position, a card supporting member 251 (see FIG. 4) in an L-shaped member 25 that constitutes each card bottom surface holding portion 103 protrudes from the opening 101a and can support the bottom surface of the peripheral edge of the probe card 200 while biasing the bottom surface. At the OPEN position, the card supporting member 251 in the L-shaped member 25 that forms each card bottom surface holding portion 103 does not protrude from the opening 101a. A detailed description of the configuration of the card bottom surface holding portion 103 is provided later with reference to FIG. 4.

The card bottom surface holding portions 103 (103a to 103c) are disposed at substantially equal intervals (intervals at substantially equal angles) relative to the opening 101a around the peripheral edge of the frame 101 in the circumferential direction. As an example, in the example illustrated in FIG. 1, the card bottom surface holding portions 103a to 103c are disposed around the peripheral edge of the frame 101 at intervals of approximately 60°.

The number of card bottom surface holding portions 103 is not particularly limited. Two or more card bottom surface holding portions 103 are preferably provided for evenly and stably holding the probe card 200.

Figure 4:
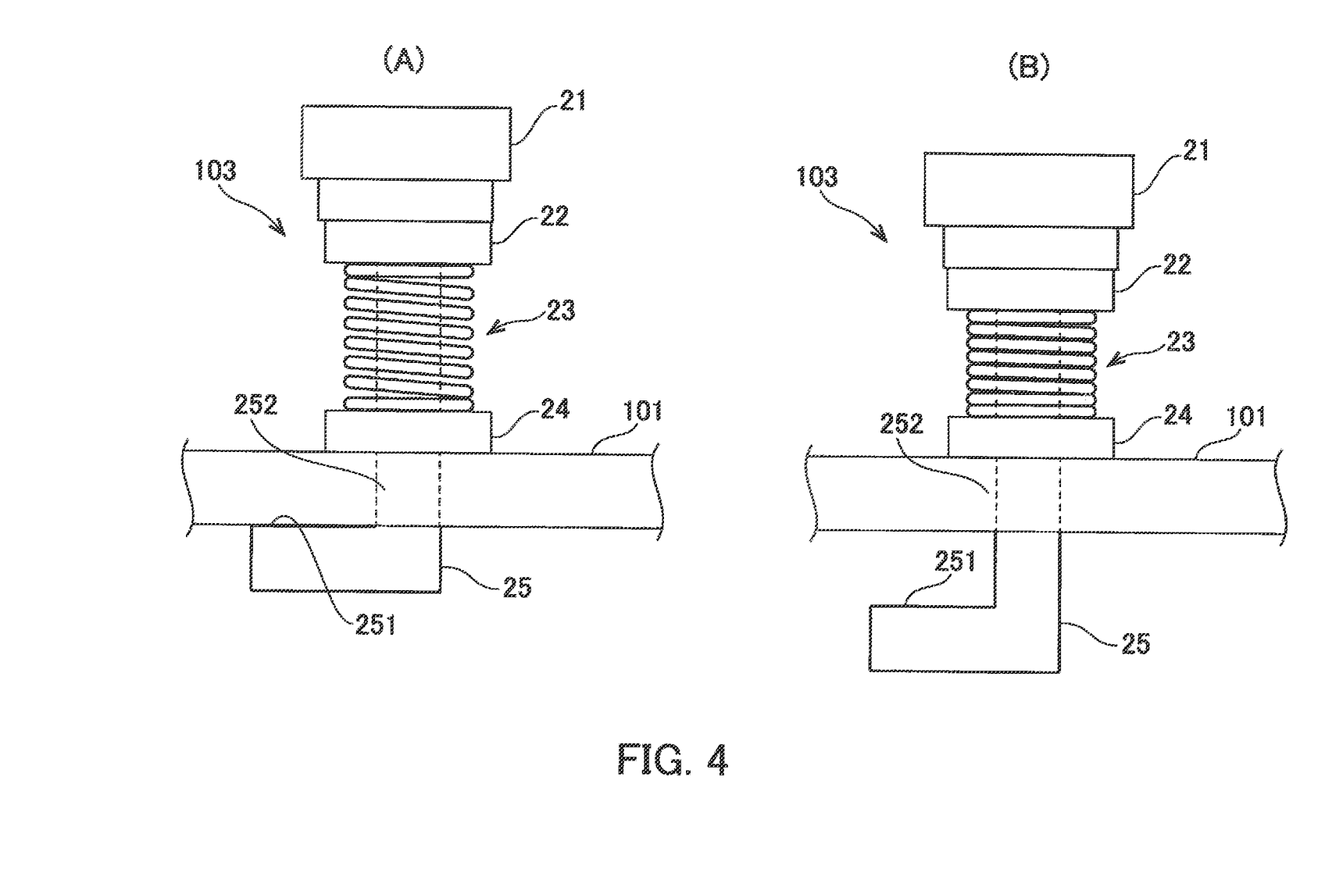
FIG. 4 is a configuration diagram for illustrating the configuration of a card bottom surface holding portion according to the first embodiment.

FIG. 4 is a configuration diagram for illustrating the configuration of the card bottom surface holding portion 103 according to the first embodiment. FIG. 4(A) illustrates a state where no downward load is applied to the card bottom surface holding portion 103 and FIG. 4(B) illustrates a state where a downward load is applied to the card bottom surface holding portion 103 when the card bottom surface holding portion 103 is pushed down.

In FIGS. 4(A) and 4(B), the card bottom surface holding portion 103 primarily includes a knob 21, a first receiver 22, a biasing member 23, a second receiver 24 and the L-shaped member 25.

For example, a base portion 252 of the L-shaped member 25 that extends in a perpendicular direction relative to the frame 101 of the probe card holder 100 is inserted into a through hole formed in the frame 101 from the bottom surface of the frame 101 and an upper portion of the base portion 252 protrudes from the top surface of the frame 101. A hole portion (not shown) formed at a central portion of the second receiver 24 is inserted into the base portion 252 of the L-shaped member 25 that protrudes toward the top surface of the frame 101. The base portion 252 is also provided with the biasing member 23 that may be, for example, a coil spring. In other words, the base portion 252 of the L-shaped member 25 is inserted into a coil spring as the biasing member 23.

In addition, the first receiver 22 is disposed above the biasing member 23. The first receiver 22 supports an upper end of the biasing member 23 that receives insertion of the top portion of the base portion 252. The upper end of the base portion 252 of the L-shaped member 25 and the knob 21 can be linked to each other using a screw or another component, with the knob 21 linked to the upper end of the base portion 252 of the L-shaped member 25.

The knob 21 is operated by the worker to apply a downward load on the biasing member 23 or rotate the L-shaped member 25.

As illustrated in FIG. 4(A), when the card bottom surface holding portion 103 is at the OPEN position, the card bottom surface holding portion 103 is subject to biasing force generated by the biasing member 23 and the knob 21 that is linked to the L-shaped member 25 is biased in a direction separating from the frame 101. As a result, the card supporting member 251 in the L-shaped member 25 makes contact with the bottom surface of the frame 101 in the probe card holder 100 while being biased upward relative to the frame 101.

When the probe card 200 is held by the probe card holder 100, the worker pushes down the knob 21 and rotates the knob 21 from the OPEN position to the LOCK position. In more detail, the biasing member 23 compresses (stores energy) when the worker applies downward force to the knob 21. When this occurs, the L-shaped member 25 also moves downward and hence the card supporting member 251 in the L-shaped member 25, which is in contact with the bottom surface of the frame 101 at the OPEN position, moves in a direction separating from the bottom surface of the frame 101. With the biasing member 23 in a compressed state, the knob 21 is rotated by the worker to cause the L-shaped member 25 linked to the knob 21 to also rotate. As a result, at the LOCK position, the card supporting member 251 in the L-shaped member 25 protrudes toward the opening 101a and is positioned below the peripheral edge of the probe card 200. Then, the worker who is pushing down the knob 21 releases the knob 21 to release the downward force applied to the knob 21. As a result, the compressed (energy-storing) biasing member 23 returns to its original state, the L-shaped member 25 moves upward and the card supporting member 215 in the L-shaped member 25 supports the bottom surface portion around the peripheral edge of the probe card 200 while biasing the bottom surface portion.

As described above, the card bottom surface holding portions 103 (103a to 103c) hold the bottom surface portions around the peripheral edge of the probe card 200 upward. Further, each card bottom surface holding portion 103 (103a to 103c) is disposed at an interval of approximately 60°. Therefore, the card bottom surface holding portions 103 can stably hold the probe card 200 below the probe card holder 100.

[Card Top Surface Supporting Portions 104]

The plurality of card top surface supporting portions 104a to 104c support top surface portions around the peripheral edge of the probe card 200 that is held upward by the plurality of card bottom surface holding portions 103 (103a to 103c).

The card top surface supporting portions 104 (104a to 104c) are provided on the bottom surface of the frame 101 around the peripheral edge of the frame 101 with respect to the opening 101a. The card top surface supporting portions 104 (104a to 104c) are arranged at substantially equal intervals (intervals at substantially equal angles) with respect to the opening 101a in the circumferential direction around the peripheral edge of the frame 101, with each card top surface supporting portion 104 at a position opposing corresponding card bottom surface holding portion 103 (103a to 103c). For example, in the example illustrated in FIG. 1, the card top surface supporting portions 104a to 104c are disposed around the peripheral edge of the frame 101 at intervals of substantially 60°.

The number of card top surface supporting portions 104 is not particularly limited. Two or more card top surface supporting portions 104 are preferably provided to evenly and stably hold the probe card 200.

In order to stably hold the probe card 200, each card top surface supporting portion 104 is preferably disposed at a position that opposes a card bottom surface holding portion 103. In the example illustrated in FIG. 1, the three card bottom surface holding portions 103a to 103c support the peripheral edge of the probe card 200 while biasing the peripheral edge upward and the three card top surface supporting portions 104a to 104c located at positions opposing the card bottom surface holding portions 103a to 103c support top surface portions around the peripheral edge of the probe card 200. With this configuration, the probe card 200 can be held in a stable and balanced manner.

Figure 5:
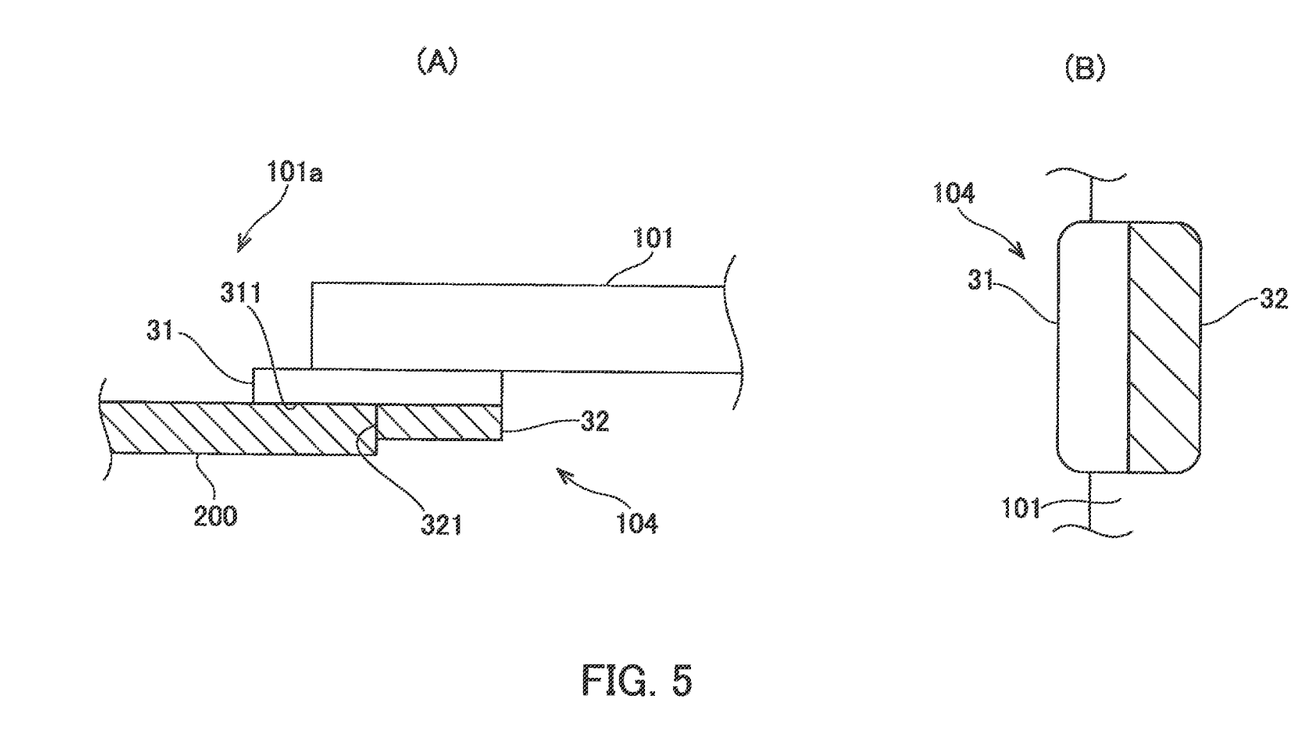
FIG. 5 is a configuration diagram for illustrating the configuration of a card top surface supporting portion according to the first embodiment.

FIG. 5 is a configuration diagram for illustrating the configuration of the card top surface support portion 104 according to the first embodiment. FIG. 5(A) is a side view of the card top surface support portion 104 and FIG. 5(B) is a bottom view of the card top surface support portion 104.

The card top surface support portion 104 has a top surface supporting portion 31 and an end face supporting portion 32. The top surface supporting portion 31 and the end face supporting portion 32 are preferably made of a material such as synthetic resin. The top surface supporting portion 31 and the end face supporting portion 32 may be independent members or may be formed integrally as one member.

The top surface supporting portion 31 supports the top surface portions around the peripheral edge of the probe card 200 that is biased upward by each card bottom surface holding portion 103. As illustrated in FIG. 5(A), the top surface supporting portion 31 is fixed to the bottom surface of the frame 101 while an end portion (end portion on the left in FIG. 5(A)) of the top surface supporting portion 31 protrudes slightly from the end portion of the frame 101 closest to the opening 101a.

The end face supporting portion 32 is disposed below the top surface supporting portion 31 to form a step portion 321 on a side lower than a bottom surface 311 of the top surface supporting portion 31. The position of the step portion 321 of the end face supporting portion 32 is determined in consideration of the size of the probe card 200 to allow for a slight amount of room for the probe card 200. Because of this, the end face around the peripheral edge of the probe card 200 that makes contact with the top surface supporting portion 31 can make contact with the step portion 321 of the end face supporting portion 32. In other words, the end face around the peripheral edge of the probe card 200 that is in contact with the top surface supporting portion 31 does not necessarily make contact with the step portion 321 of the end face supporting portion 32 and, when the probe card 200 slightly moves horizontally, the end face of the peripheral edge of the probe card 200 abuts against the step portion 321 of the end face supporting portion 32 and can suppress horizontal deviation of the probe card 200.

This embodiment has dealt with an exemplary case in which the step portion 321 of the end face supporting portion 32 is linear along the longitudinal direction of the card top surface supporting portion 104, but the step portion 321 may be formed into an arc shape depending on the shape of the probe card 200.

(A-2) Effects of First Embodiment

As described above, according to the first embodiment, the opening is formed at a central portion of the frame in the probe card holder. Therefore, a worker can check the state of the top surface of the probe card that is being held.

According to the first embodiment, the plurality of card bottom surface holding portions support the peripheral edge of the probe card while biasing the peripheral edge upward and the plurality of card top surface supporting portions at positions corresponding to the card bottom surface holding portions support top surface portions around the peripheral edge of the probe card. With this configuration, the probe card can be held in a stable and balanced manner.

According to the first embodiment, the probe card is held on the bottom side of the probe card holder and the probe card can be stably held by the worker performing a simple operation of pushing down and rotating the knobs of the card bottom surface holding portions and then releasing the knobs.

According to the first embodiment, the card top surface supporting portions that support the top surface portions around the peripheral edge of the probe card include step portions and therefore horizontal deviation of the held probe card can be suppressed.

(B) Second Embodiment

Next, a second embodiment of the probe card holder according to the present disclosure is described with reference to the drawings.

(B-1) Configuration of Second Embodiment

Figure 6:
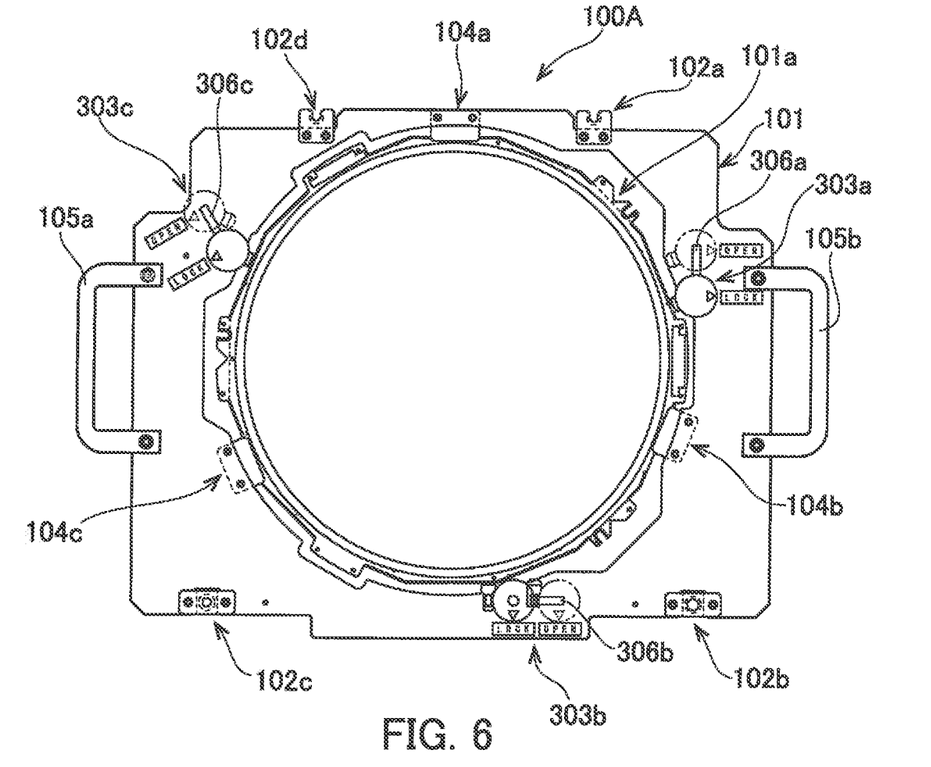
FIG. 6 is a plan view for illustrating a probe card holder according to a second embodiment.
Figure 7:
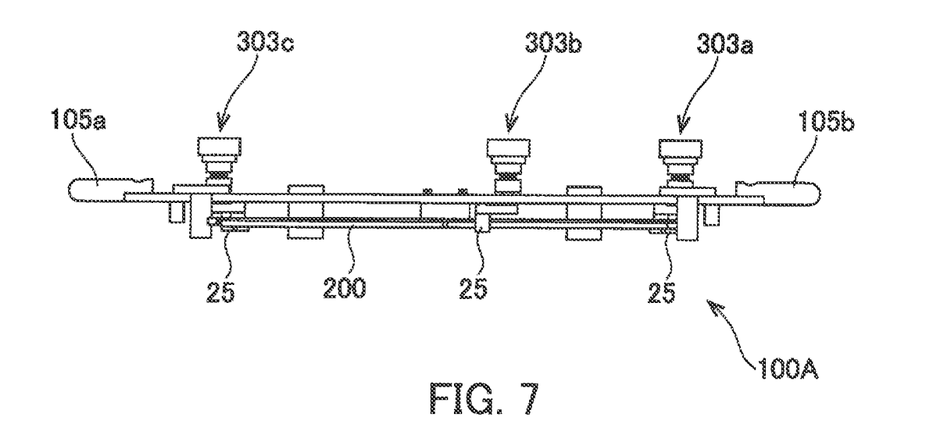
FIG. 7 is a side view of the probe card holder according to the second embodiment.

FIG. 6 is a plan view of the probe card holder according to the second embodiment. FIG. 7 is a side view of the probe card holder according to the second embodiment.

A probe card holder 100A according to the second embodiment includes the frame 101, a plurality of (for example, four) positioning blocks 102 (102a to 102d), a plurality of (for example, three) card bottom surface holding portions 303 (303a to 303c), a plurality of (for example, three) card top surface supporting portions 104 (104a to 104c) and a plurality of (for example, two) handles 105a and 105b.

The probe card holder 100A according to the second embodiment differs from that of the first embodiment in terms of the configuration of card bottom surface holding members 303. Therefore, the following description will focus on the configuration of the card bottom surface holding members 303.

In each card bottom surface holding portion 103 according to the first embodiment, the L-shaped member 25 is rotated using the knob 21 to cause the card supporting portion 251 in the L-shaped member 25 to protrude toward the opening 101a.

In each card bottom surface holding portion 303 according to the second embodiment, the card bottom surface holding portion 303 itself is slid along the frame 101 to cause the card supporting portion 251 in the L-shaped member 25 to protrude toward the opening 101a.

A configuration corresponding to that illustrated in FIGS. 4(A) and 4(B) according to the first embodiment can be applied as the basic configuration of each card bottom surface holding portion 303. Therefore, the configuration of the card bottom surface holding portion 303 is described with reference to FIGS. 4(A) and 4(B) as necessary.

In the frame 101 of the probe card holder 100A, guide portions 306 (306a to 306c) that guide the card bottom surface holding portions 303 (303a to 303c) that slide from the OPEN position to the LOCK position are provided at the positions of the card bottom surface holding portions 303 (303a to 303c). The guide portions 306 (306a to 306c) can be formed as, for example, long holes.

When each card bottom surface holding portion 303 is at the OPEN position, the card bottom surface holding portion 303 is subject to biasing force generated by the biasing members 23 and the knobs 21 that are linked to the L-shaped members 25 are biased in a direction separating from the frame 101. Therefore, the card supporting members 251 in the L-shaped members 25 make contact with the bottom surface of the frame 101 while being biased upward relative to the frame 101 of the probe card holder 100A.

When the probe card 200 is held by the probe card holder 100A, the worker slides the knobs 21 from the OPEN position to the LOCK position while pushing the knobs 21 down.

More specifically, the biasing member 23 compresses (stores energy) when the worker applies a downward load on the knobs 21. The L-shaped member 25 also moves downward, and hence the card supporting member 251 in the L-shaped member 25 that is in contact with the bottom surface of the frame 101 moves in a direction separating from the bottom surface of the frame 101. With the biasing member 23 in a compressed state, the worker moves the knob 21 toward the opening 101a and the L-shaped member 25 that is linked to the knob 21 also moves toward the opening 101a. At the LOCK position, the card supporting member 251 in the L-shaped member 25 protrudes toward the opening 101a to be located on the lower side of the peripheral edge of the probe card 200. Then, when the worker removes his/her finger from the knob that he/she has been pushing down, the downward load applied on the knob 21 is released, the compressed (energy-storing) biasing member 23 returns to its original state, the L-shaped member 25 moves upward and the card supporting portion 215 in the L-shaped member 25 supports the bottom surface portions around the peripheral edge of the probe card 200 while biasing the bottom surface portions.

As described above, each card bottom surface holding portion 303a to 303c can support a bottom surface portion around the peripheral edge of the probe card 200 while biasing that bottom surface portion upward.

Similar to the first embodiment, each card top surface supporting portion 104 supports a top surface portion around the peripheral edge of the probe card 200. Therefore, the probe card can be held in a balanced and stable manner.

(B-2) Effect of Second Embodiment

As described above, according to the second embodiment, the same effects as those according to the first embodiment can be obtained.

According to the second embodiment, the probe card can be stably held through a simple operation of pushing down and sliding the knobs of each card bottom surface holding portion.

REFERENCE SYMBOLS LIST 100 and 100A . . . probe card holder, 101 . . . frame, 101 . . . opening, 102 (102a to 102c) . . . positioning block, 103 (103a to 103c) and 303 (303a to 303c) . . . card bottom surface holding portion, 21 . . . knob, 22 . . . first receiver, 23 . . . biasing member, 24 . . . second receiver, 25 . . . L-shaped member, 251 . . . card supporting portion, 252 . . . base portion, 104 (104a to 104c) . . . card top surface supporting member, 31 . . . top surface supporting member, 311 . . . bottom surface, 32 . . . end face supporting portion, 321 . . . step portion, 105a and 105b . . . handle, 306a to 306c . . . guide portion.

The invention claimed is:

1. A probe card holder for holding a probe card on a bottom side of a plate-shaped frame, the probe card holder comprising:
the plate-shaped frame that is formed with an opening at a central portion of the frame, the opening approximately the same size as the probe card;
a plurality of card bottom surface holding portions that are provided around a peripheral edge of the opening in the frame and that hold a peripheral bottom surface of the probe card while biasing the bottom surface upward; and
a plurality of card top surface supporting portions that are provided on a bottom surface of the peripheral edge of the opening in the frame and that support a peripheral top surface of the probe card that is held by the plurality of card bottom surface holding portions,
each card bottom surface holding portion comprising:
an L-shaped member with a base portion provided from the bottom surface to the top surface of the frame, and a bottom surface supporting portion located on the bottom side of the frame;
a knob that is linked to a tip end portion of the base portion of the L-shaped member; and
a biasing member that is disposed between the knob and the top surface of the frame and that biases the bottom surface supporting member in the L-shaped member upward toward the bottom surface of the frame.

2. The probe card holder according to claim 1, wherein the knob of each card bottom surface holding portion can rotate, and rotation of the knob causes the bottom surface supporting portion in the L-shaped member linked to the knob to protrude toward the opening in the frame.

3. The probe card holder according to claim 1, wherein the knob in each card bottom surface holding portion can slide toward the opening in the frame, and sliding of the knob causes the bottom surface supporting portion in the L-shaped member linked to the knob to protrude toward the opening in the frame.

4. The probe card holder according to claim 3, wherein each card top surface supporting member includes:
 a top surface supporting member that supports the top surface of the peripheral edge of the probe card; and
 a step portion that supports an end face of the peripheral edge of the probe card.

5. The probe card holder according to claim 1, wherein:
 the plurality of card bottom surface holding portions are disposed at substantially equal intervals in a circumferential direction of the peripheral edge of the opening in the frame; and
 the plurality of card top surface supporting portions are disposed at substantially equal intervals in the circumferential direction of the peripheral edge of the opening in the frame at positions that oppose corresponding card bottom surface holding portions.

6. The probe card holder according to claim 1, wherein each card top surface supporting member includes:
 a top surface supporting member that supports the top surface of the peripheral edge of the probe card; and
 a step portion that supports an end face of the peripheral edge of the probe card.

7. The probe card holder according to claim 2, wherein each card top surface supporting member includes:
 a top surface supporting member that supports the top surface of the peripheral edge of the probe card; and
 a step portion that supports an end face of the peripheral edge of the probe card.

\* \* \* \* \*